United States Patent
Lai

(10) Patent No.: US 8,253,692 B2
(45) Date of Patent: Aug. 28, 2012

(54) TOP-EMITTING OLED DISPLAY HAVING TRANSPARENT TOUCH PANEL

(75) Inventor: Yuang Wei Lai, Changhua (TW)

(73) Assignee: RITDISPLAY Corporation, Hsin Chu (TW)

( * ) Notice: Subject to any disclaimer, the term of this patent is extended or adjusted under 35 U.S.C. 154(b) by 1207 days.

(21) Appl. No.: 11/783,842

(22) Filed: Apr. 12, 2007

(65) Prior Publication Data

US 2007/0242055 A1 Oct. 18, 2007

(30) Foreign Application Priority Data

Apr. 14, 2006 (TW) .................................. 95113483

(51) Int. Cl.
*G09G 5/00* (2006.01)

(52) U.S. Cl. ........ 345/173; 345/156; 345/174; 345/178; 313/463; 313/572; 178/18.01; 178/18.06; 178/18.07

(58) Field of Classification Search .................. 345/172, 345/168, 104, 156, 157, 87, 179, 102, 76–83, 345/107, 173–178; 341/23; 178/18.01, 18.03, 178/18.06, 18.07; 313/463–572

See application file for complete search history.

(56) References Cited

U.S. PATENT DOCUMENTS

| | | | |
|---|---|---|---|
| 2002/0186208 A1 | 12/2002 | Feldman et al. | |
| 2003/0064540 A1* | 4/2003 | Auch et al. | 438/99 |
| 2004/0080267 A1* | 4/2004 | Cok | 313/512 |
| 2004/0090426 A1 | 5/2004 | Bourdelais et al. | |
| 2007/0248799 A1* | 10/2007 | DeAngelis et al. | 428/209 |

* cited by examiner

*Primary Examiner* — Lun-Yi Lao
*Assistant Examiner* — Olga Merkoulova
(74) *Attorney, Agent, or Firm* — WPAT, P.C.; Anthony King

(57) ABSTRACT

A top-emitting OLED display having a transparent touch panel includes a substrate, an upper cover plate, an OLED display device, a capacitive touch device and a sealant layer. The OLED device is stacked on the substrate, the capacitive touch device is stacked on the upper cover plate, and the sealant layer combines the substrate and the upper cover plate such that the OLED device and the capacitive touch device are enclosed between the substrate and the upper cover plate. The capacitive touch device includes a first transparent conductive layer, an isolating layer, a second transparent conductive layer and an electromagnetic shielding layer sequentially formed on the upper cover plate. The electromagnetic shielding layer can effectively reduce the electromagnetic interfering between the OLED device and the capacitive touch device.

7 Claims, 4 Drawing Sheets

TOP-EMITTING OLED DISPLAY HAVING TRANSPARENT TOUCH PANEL

BACKGROUND OF THE INVENTION

1. Field of the Invention

The present invention relates to a transparent touch screen, and more particularly to a top-emitting OLED (Organic Light Emitting Diode) display having a transparent touch panel.

2. Description of the Related Art

Currently, OLED display devices are divided into two light emitting modes that are the bottom-emitting mode and the top-emitting mode. Since rays emitted by the organic light emitting layer of a bottom-emitting OLED may be shielded by the thin-film transistors (TFT) on the substrate, the aperture ratio is reduced by the TFTs. Therefore, the top-emitting OLED is an effective solution to improve the ratio of effective light emitting areas to total areas such that is superior to a conventional active LED display apparatus.

The touch screen is a simple, humanized and space-saving input apparatus widely applied in tourist guiding systems, automatic teller machines (ATMs), palm computers, point-of-sale (POS) terminals and industrial control systems and so on.

US Patent Publication No. US 2002/0186208 A1 discloses an electroluminescent display apparatus with a touch screen, which includes a transparent substrate, a resistive touch device disposed on one surface of the transparent substrate and an electroluminescent display device disposed on the other surface of the transparent substrate. However, the resistive touch device and the electrolurminescent device fabricated on two surfaces of the transparent substrate are likely to get scratches during the manufacturing process. Moreover, the sensitivity of the resistive touch device is relatively low.

US Patent Publication No. 2004/0080267 A1 discloses an integrated device of an organic light emitting display and a touch screen. The resistive touch device is formed on a cover in advance, and then the cover is mounted on the organic light emitting display. However, the resistive touch device has low sensitivity, and can adequately detect any input only when being pressed by an object with a sharp end, such as a pen. Therefore, the resistive touch device is easy to be scratched in use. Moreover, when the organic light emitting display is combined with the cover, the resistive touch device fabricated on the cover is easy to be damaged.

US Patent Publication No. 2004/0090426 A1 discloses an integrated device of an organic light emitting display and a touch screen. The resistive touch device is formed on the surface of the transparent substrate (or cover) of the packaged organic light emitting display. However, the fabricating method disclosed in US 2004/0090426 A1 is rather complicated, and the service life of the organic luminescent material is shortened due to the process of the resistive touch device. Moreover, the sensitivity of the resistive touch device is relatively low.

In view of the above, a touch panel capable of precisely and sensitively sensing any meaningful touches is needed urgently on the market, and its transparent structure facilitates the touch panels as a input device to be widely applied to various display screens.

SUMMARY OF THE INVENTION

An objective of the present invention is to provide a top-emitting OLED display having a transparent touch panel, which has various advantages such as high light transmittance, high sensitivity and anti-scratch.

The top-emitting OLED display having a transparent touch panel in accordance with the present invention comprises a substrate, an upper cover, an OLED device, a capacitive touch device and a sealing layer.

The OLED device is stacked on the substrate, and the capacitive touch device is stacked on the upper cover plate. The sealing layer combines the substrate with the upper cover respectively so that the OLED device is enclosed between the substrate and the upper cover.

The capacitive touch device comprises a first transparent conductive layer, an isolating layer and a second transparent conductive layer sequentially formed on the surface of the upper cover, and the capacitive touch device is enclosed between the substrate and the upper cover plate.

Regarding the detection of the capacitive touch device, the first transparent conductive layer and the second transparent conductive layer are externally connected to a power supply and a signal line so that a capacitor structure is formed and electric lines are generated between the two transparent conductive layers, wherein the intensity of the power line directly influences the capacitance value. When the upper cover plate is touched by a conductive object or finger, the intensity of the electric lines between the first transparent conductive layer and the second transparent conductive layer is changed, and the capacitance value is changed accordingly. By using the externally connected signal line to detect the change of the capacitance value, the touch position can be identified.

The capacitive touch device can further comprise an electromagnetic shielding layer having a polymer insulating layer and a transparent conductive layer. The electromagnetic shielding layer can effectively reduce electromagnetic interfering between the OLED structure and the capacitive touch device.

BRIEF DESCRIPTION OF THE DRAWINGS

The invention will be described according to the appended drawings in which.

PREFERRED EMBODIMENT OF THE PRESENT INVENTION

Figure 1:
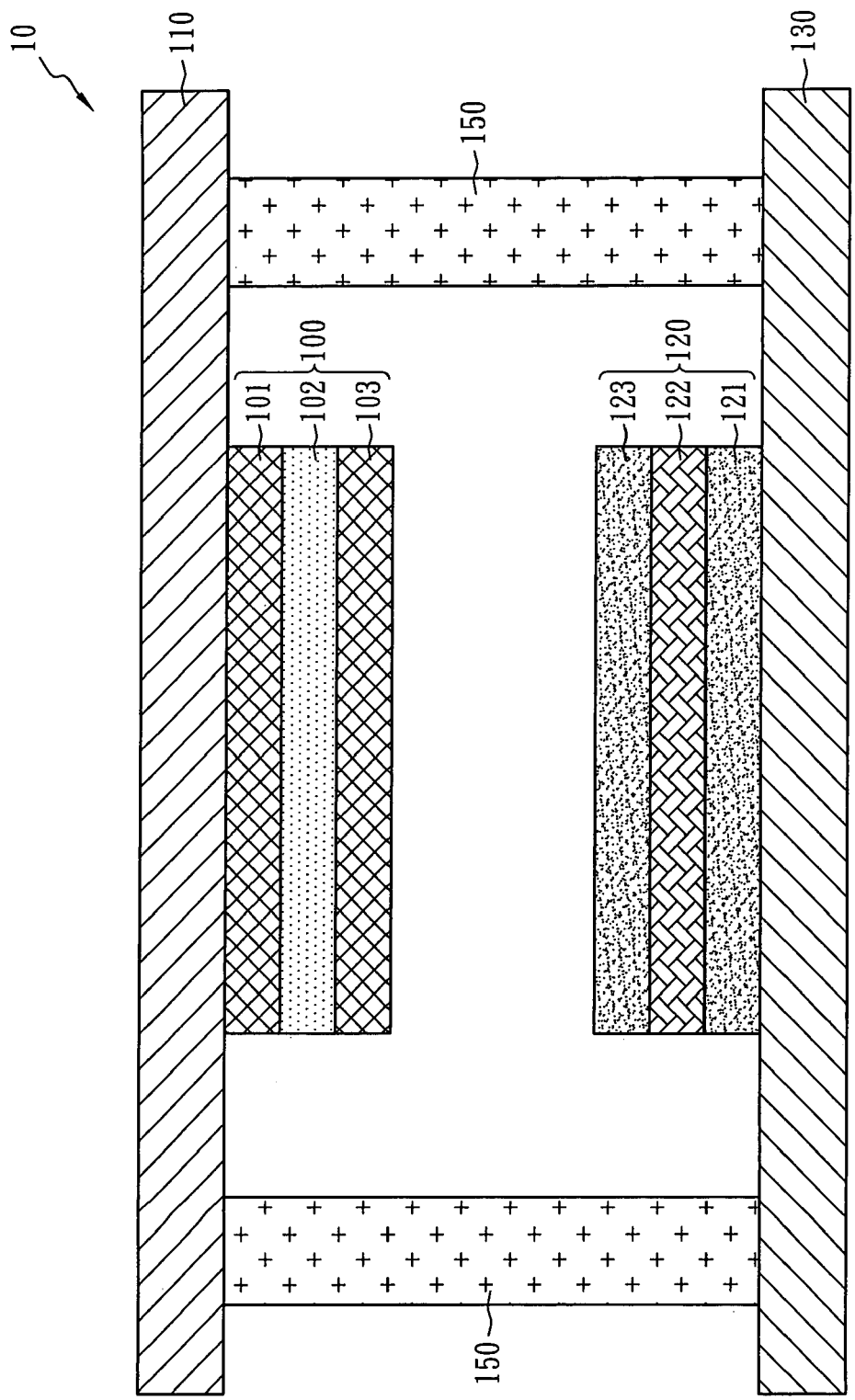
FIG. 1 is a schematic sectional view of a top-emitting OLED display having a transparent touch panel in accordance with the first embodiment of the present invention.

FIG. 1 is a schematic sectional view of a top-emitting OLED display having a transparent touch panel in accordance with the first embodiment of the present invention. The transparent touch screen 10 includes a substrate 130, an upper cover plate 110, an OLED device 120, a capacitive touch device 100 and a sealant layer 150.

The OLED device 120 is stacked on the substrate 130, and the capacitive touch device 100 is stacked on the surface of the upper cover plate 110. The sealant layer 150 combines the substrate 130 and the upper cover plate 110 such that the OLED device 120 is sealed in an enclosed space.

The capacitive touch device 100 includes a first transparent conductive layer 101, an isolating layer 102 and a second transparent conductive layer 103 sequentially formed on the upper cover plate 110. However, the structure of the capacitive touch device is not limited to the present embodiment, that is, the second transparent conductive layer and the first transparent conductive layer can be simultaneously formed on the surface of the upper cover plate 110.

The operating principle of the capacitive touch sensitive structure 100 is that the first transparent conductive layer 101 and the second transparent conductive layer 103 are externally connected to a power supply and a signal line, such that a capacitor structure is formed and electric lines are generated between the first transparent conductive layer 101 and the second transparent conductive layer 103, wherein the intensity of the electric lines directly influences the capacitance value.

When the upper cover plate 110 is touched by a conductive object or finger, the intensity of the electric lines between the first transparent conductive layer 101 and the second transparent conductive layer 103 is changed, and the capacitance is changed accordingly. By using the externally connected signal line to detect the change of the capacitance value, the touch position can be identified.

The OLED device 120 includes an anode layer 121, a light emitting layer 122 and a cathode layer 123 sequentially formed on the substrate 130.

The material of the first transparent conductive layer 101 and the second transparent conductive layer 103 is indium tin oxide (ITO), indium zinc oxide (IZO) or aluminum zinc oxide (AZO). The material of the isolating layer 102 is epoxy, poly-imide or methyl methacrylate.

The material of the substrate 130 and the upper cover plate 110 is a transparent material such as glass, polycarbonate (PC) or polyvinyl chloride (PVC).

Figure 2:
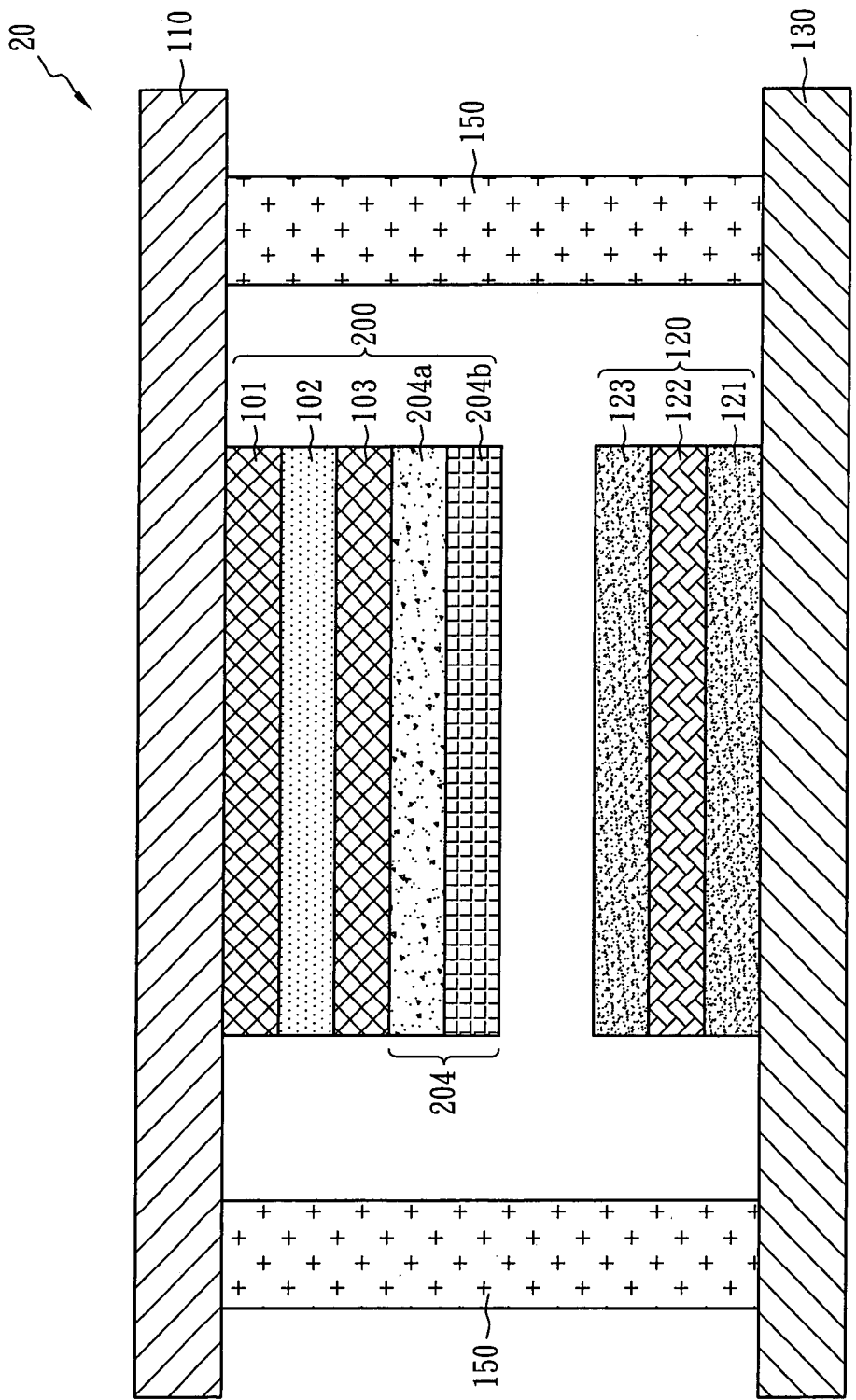
FIG. 2 is a schematic sectional view of a top-emitting OLED display having a transparent touch panel in accordance with the second embodiment of the present invention.

FIG. 2 is a schematic sectional view of a top-emitting OLED transparent touch screen 20 to the second embodiment of the present invention. Compared with the transparent touch screen 10 of the first embodiment of the present invention, the capacitive touch device 200 further includes an electromagnetic shielding layer 204. The electromagnetic shielding layer 204 includes a polymer insulating layer 204a and a transparent conductive layer 204b. The capacitive touch device 200 includes the first transparent conductive layer 101, the insulating layer 102, the second transparent conductive layer 103, the polymer insulating layer 204a and the transparent conductive layer 204b sequentially formed on the upper cover plate 110.

The electromagnetic shielding layer 204 can effectively reduce the electromagnetic interfering between the OLED device 120 and the capacitive touch device 201.

The material of the polymer insulating layer 204a is epoxy, poly-imide or methyl methacrylate. The material of the transparent conductive layer 204b is ITO, IZO or AZO.

Figure 3:
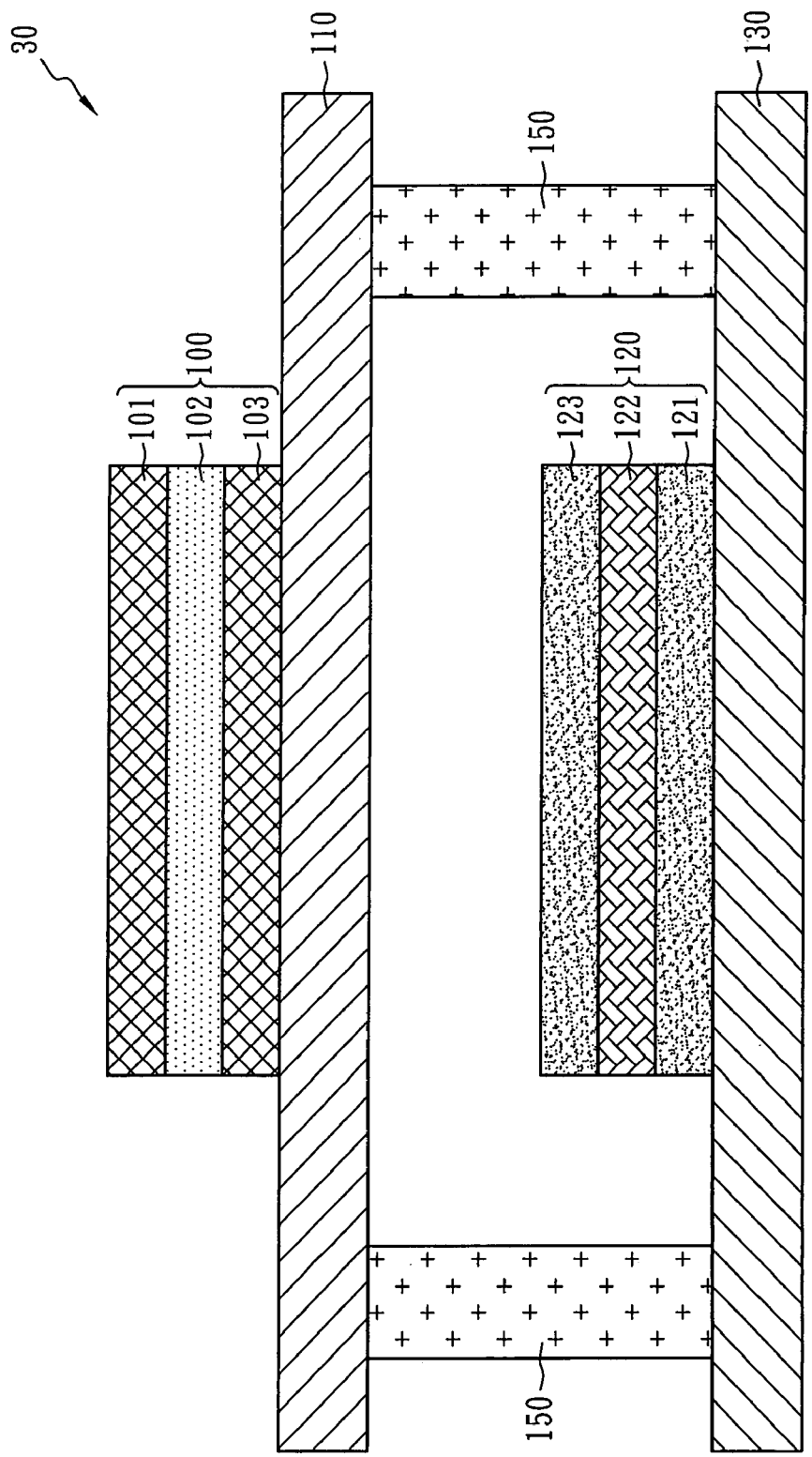
FIG. 3 is a schematic sectional view of a top-emitting OLED display having a transparent touch panel in accordance with the third embodiment of the present invention.
Figure 4:
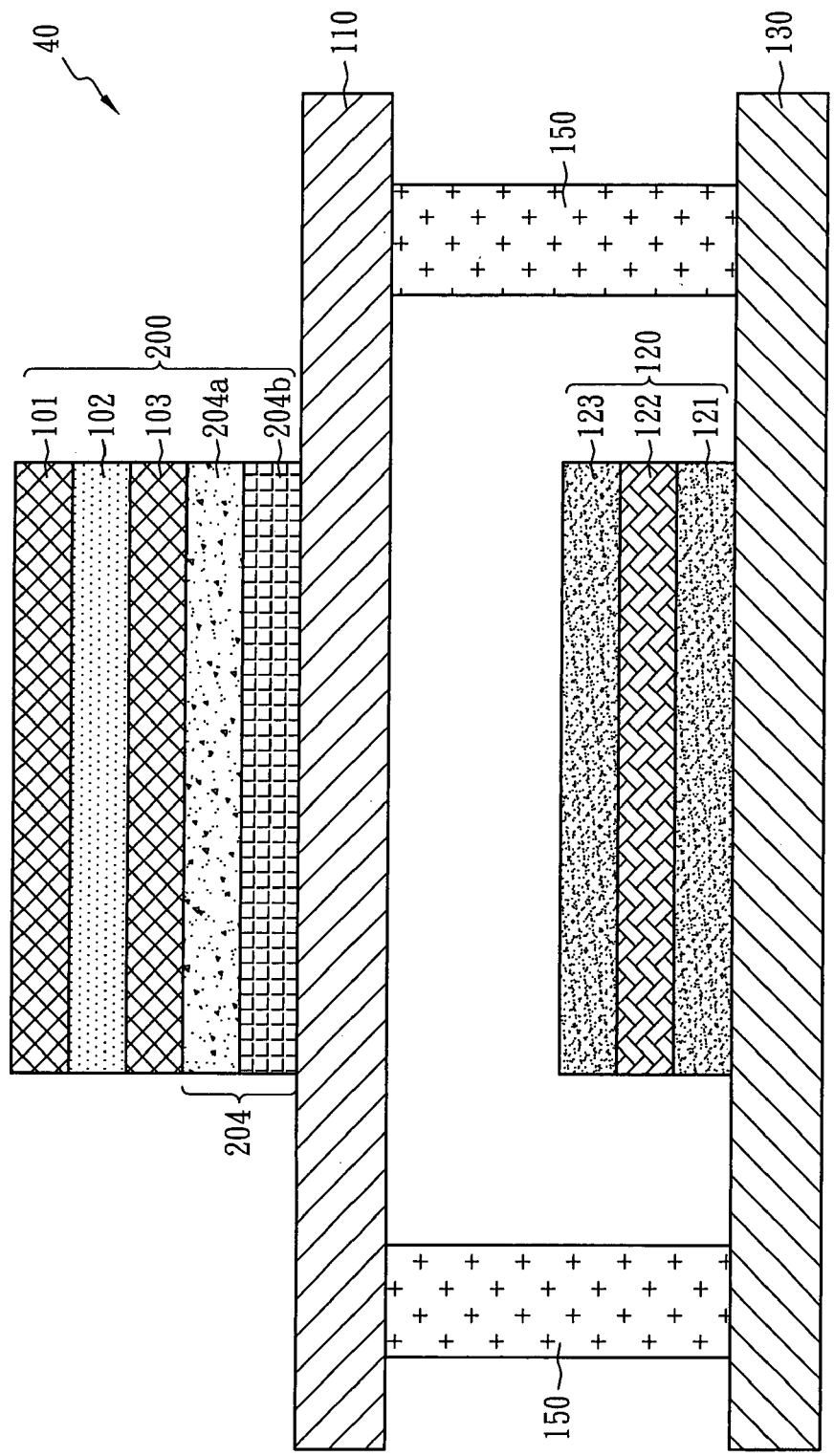
FIG. 4 is a schematic sectional view of a top-emitting OLED display having a transparent touch panel in accordance with the forth embodiment of the present invention.

The transparent touch screens in the first and second embodiments can be modified as transparent touch screens 30 and 40, as shown in FIGS. 3 and 4. In other words, the capacitive touch devices 100 and 200 are respectively disposed on the upper surface of the upper cover plate 110.

The aforementioned descriptions of the present invention are intended to be illustrative only. Numerous alternative methods may be devised by persons skilled in the art without departing from the scope of the following claims.

What is claimed is:

1. A top-emitting organic light emitting diode (OLED) display having a transparent touch panel, comprising: a substrate; an upper cover plate; an OLED device stacked on the substrate; a capacitive touch device stacked on a surface of the upper cover plate; and a sealant layer surrounding the OLED device; wherein the OLED device is enclosed sealed by the substrate, the sealant layer, and the upper cover plate, and the upper cover plate is attached to the substrate by the sealant layer; and wherein the capacitive touch device comprises a first transparent conductive layer, an isolating layer and a second transparent conductive layer sequentially formed on a lower surface of the upper cover plate, and the first transparent conductive layer and the second transparent conductive layer form a capacitor, wherein the capacitive touch device further comprises an electromagnetic shielding layer stacked on the second transparent conductive layer, said electromagnetic shielding layer effectively reduces the electromagnetic interfering between the OLED display and the capacitive touch device; and wherein the electromagnetic shielding layer comprises a polymer insulating layer and a transparent conductive layer.

2. The top-emitting OLED display having a transparent touch panel of claim 1, wherein the material of the polymer insulating layer is selected from the group consisting substantially of epoxy, poly-imide and methyl methacrylate.

3. The top-emitting OLED display having a transparent touch panel of claim 1, wherein the transparent conductive layer is selected from the group consisting substantially of indium tin oxide (ITO), indium zinc oxide (IZO) and aluminum zinc oxide (AZO).

4. The top-emitting OLED display having a transparent touch panel of claim 1, wherein the OLED device comprises an anode layer, a light emitting layer and a cathode layer sequentially formed on the substrate.

5. The top-emitting OLED display having a transparent touch panel of claim 1, wherein the first transparent conductive layer and the second transparent conductive layer are selected from the group consisting substantially of ITO, IZO and AZO.

6. The top-emitting OLED display having a transparent touch panel of claim 1, wherein the isolating layer is selected from the group consisting substantially of epoxy, poly-imide and methyl methacrylate.

7. The top-emitting OLED display having a transparent touch panel of claim 1, wherein the substrate and the upper cover plate are selected from the group consisting substantially of glass, polycarbonate and polyvinyl chloride.

* * * * *